US011016124B2

United States Patent
Li et al.

(10) Patent No.: US 11,016,124 B2
(45) Date of Patent: May 25, 2021

(54) INTEGRATED CURRENT SENSOR

(71) Applicant: ACEINNA Transducer Systems Co., Ltd., Wuxi (CN)

(72) Inventors: Dalai Li, Wuxi (CN); Leyue Jiang, Wuxi (CN)

(73) Assignee: ACEINNA TRANSDUCER SYSTEMS CO, LTD., Wuxi (CN)

( * ) Notice: Subject to any disclaimer, the term of this patent is extended or adjusted under 35 U.S.C. 154(b) by 0 days.

(21) Appl. No.: 16/711,462

(22) Filed: Dec. 12, 2019

(65) Prior Publication Data

US 2020/0209285 A1 Jul. 2, 2020

(30) Foreign Application Priority Data

Dec. 26, 2018 (CN) .......................... 201811600055.0

(51) Int. Cl.
*G01R 15/20* (2006.01)
*G01R 19/00* (2006.01)

(52) U.S. Cl.
CPC ....... *G01R 15/205* (2013.01); *G01R 19/0092* (2013.01)

(58) Field of Classification Search
CPC . G01R 15/205; G01R 15/207; G01R 19/0092
See application file for complete search history.

(56) References Cited

U.S. PATENT DOCUMENTS

| 8,080,994 B2 * | 12/2011 | Taylor | G01R 33/07 |
| | | | 324/252 |
| 10,481,181 B2 * | 11/2019 | Bussing | G01R 15/207 |
| 2004/0155644 A1 * | 8/2004 | Stauth | G01R 15/207 |
| | | | 324/117 R |
| 2013/0020660 A1 * | 1/2013 | Milano | G01R 15/207 |
| | | | 257/427 |
| 2018/0158765 A1 * | 6/2018 | Montero | H01L 24/49 |
| 2019/0391185 A1 * | 12/2019 | El Bacha | G01R 15/205 |

* cited by examiner

*Primary Examiner* — Dominic E Hawkins
(74) *Attorney, Agent, or Firm* — EcoTech Law Group, P.C.

(57) ABSTRACT

An integrated current sensor is provided in the present invention. The integrated current sensor includes: a conductor comprising at least one current input pin, at least one current output pin, a first leg portion connected to the at least one current input pin, a second leg portion connected to the at least one current output pin, and a connection portion connected between the first leg portion and the second leg portion; a magnetoresistive sensing and signal processing unit; an isolation unit configured to be sandwiched between the magnetoresistive sensing and signal processing unit and the conductor; a plurality of signal pins configured for being coupled to the magnetoresistive sensing and signal processing unit via wires respectively; and a package body configured for wrapping part of the conductor, part of the signal pins, the isolation unit and the magnetoresistive sensing and signal processing unit. A direction of current on the first leg portion is opposite to a direction of current on the second leg portion. The signal pins, the at least one current input pin and the at least one current output pin are exposed from the package body. In this way, the integrated current sensor may realize good electrical isolation between a current side and a signal side. In addition, the integrated current sensor has high sensitivity and integration degree due to use of a magnetoresistive sensing way.

9 Claims, 4 Drawing Sheets

INTEGRATED CURRENT SENSOR

RELATED APPLICATION

This application claims the priority from CN Application having Serial No. 201811600055.0, filed on Dec. 26, 2018, which are incorporated herein by reference for all purposes.

1. FIELD OF THE INVENTION

The present invention relates to the field of current sensors, and more particularly relates to an improved integrated current sensor.

2. BACKGROUND TECHNIQUE

For current sensors, there are two traditional implementations. The first one is an Ohm's law-based shunt resistor which has the disadvantages of no electrical isolation between a current side and a signal side and relatively low safety performance. The second one is a Hall effect-based current sensor which has the disadvantages of low sensitivity and high noise.

Therefore, it is necessary to provide an improved current sensor to solve the above problems.

SUMMARY OF THE INVENTION

An integrated current sensor with high sensitivity, high integration degree and good isolation between a current side and a signal side is provided according to one embodiment of the present invention.

According to one aspect of the present invention, the present invention provides an integrated current sensor. An integrated current sensor, comprising: a conductor comprising at least one current input pin, at least one current output pin, a first leg portion connected to the at least one current input pin, a second leg portion connected to the at least one current output pin, and a connection portion connected between the first leg portion and the second leg portion; a magnetoresistive sensing and signal processing unit; an isolation unit configured to be sandwiched between the magnetoresistive sensing and signal processing unit and the conductor; a plurality of signal pins configured for being coupled to the magnetoresistive sensing and signal processing unit via wires respectively; and a package body configured for wrapping part of the conductor, part of the signal pins, the isolation unit and the magnetoresistive sensing and signal processing unit. A direction of current on the first leg portion is opposite to a direction of current on the second leg portion, the signal pins, the at least one current input pin and the at least one current output pin are exposed from the package body.

The current sensor in the present invention has the isolation unit disposed between the conductor and the magnetoresistive sensing and signal processing unit, so that good electrical isolation between the current side and the signal side may be realized. In addition, the integrated current sensor has high sensitivity and integration degree due to use of a magnetoresistive sensing way.

BRIEF DESCRIPTION OF THE DRAWINGS

The drawings described herein are provided to further understand the present application, and are intended to be a part of this application. In the drawing.

DETAILED DESCRIPTION OF THE INVENTION

In order to make the schemes and advantages of the embodiments of the present invention clearer, the exemplary embodiments of the present invention are further described in detail with reference to the accompanying drawings. Obviously, the described embodiments are only part of the embodiments of the present invention, and not all exhaustive embodiments. It should be noted that the embodiments of the present invention and the features of the embodiments may be combined with each other in case of no conflict.

The present invention provides an improved integrated current sensor with high sensitivity, high integration degree and good isolation between a current side and a signal side.

Figure 1:
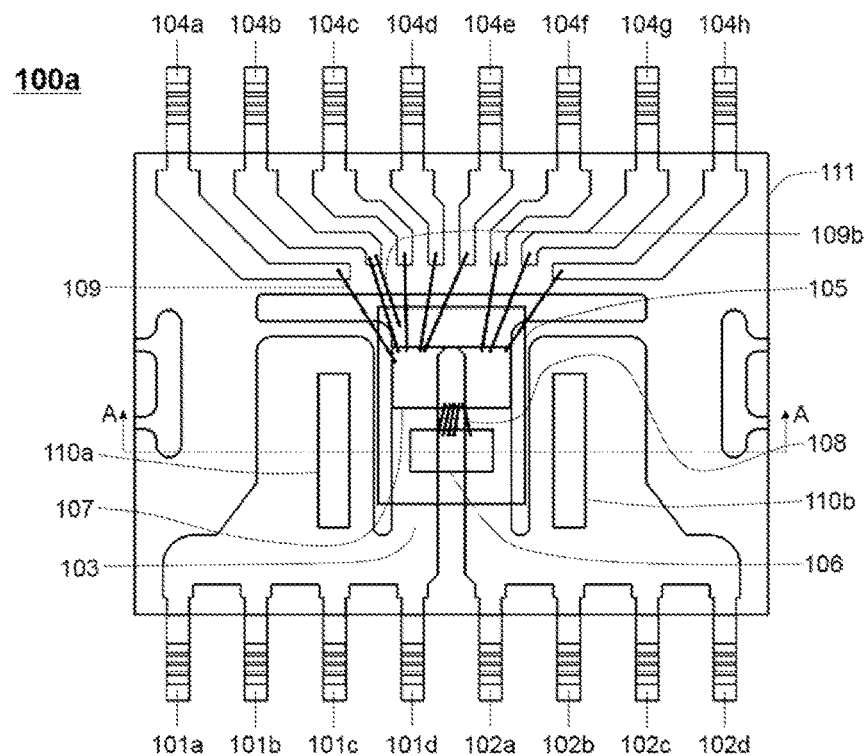
FIG. 1 is a top-viewed schematic perspective diagram of an improved integrated current sensor according to one embodiment of the present invention.
Figure 2:
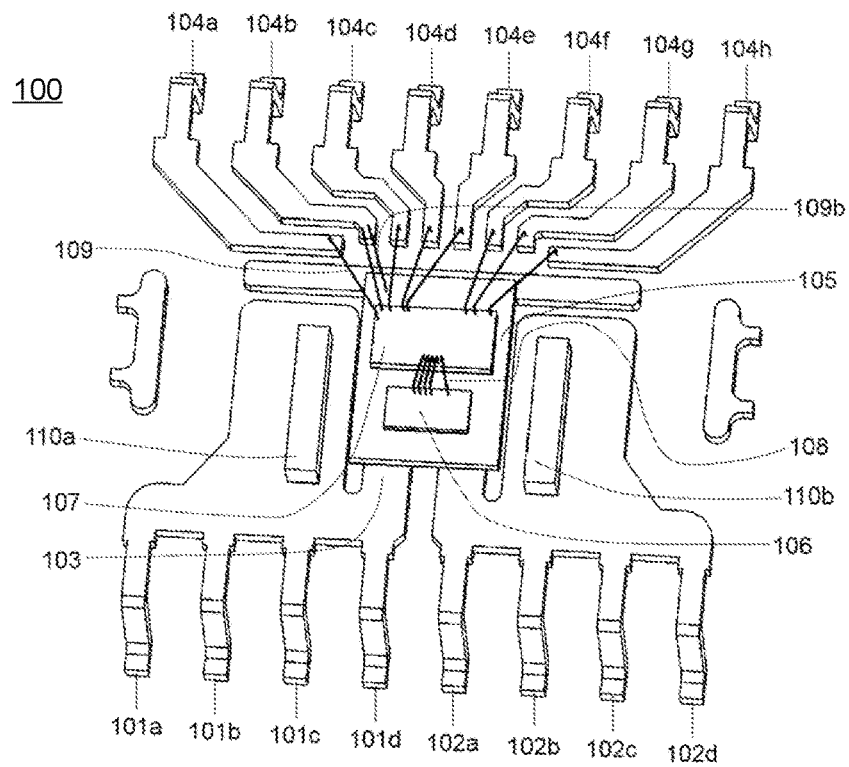
FIG. 2 is a schematic perspective diagram of the improved integrated current sensor shown in FIG. 1, wherein a package body of the improved integrated current sensor is removed.

FIG. 1 is a top-viewed schematic perspective diagram of an improved integrated current sensor 100 according to one embodiment of the present invention. FIG. 2 is a schematic perspective diagram of the improved integrated current sensor 100 shown in FIG. 1, wherein a package body of the improved integrated current sensor is removed. As shown in FIG. 1 and FIG. 2, the integrated current sensor 100 includes a conductor 103, an isolation unit 105, a magnetoresistive sensing and signal processing unit, a plurality of signal pins 104a, 104b, 104c, 104d, 104e, 104f, 104g and 104h, and a package body 111.

Figure 3:
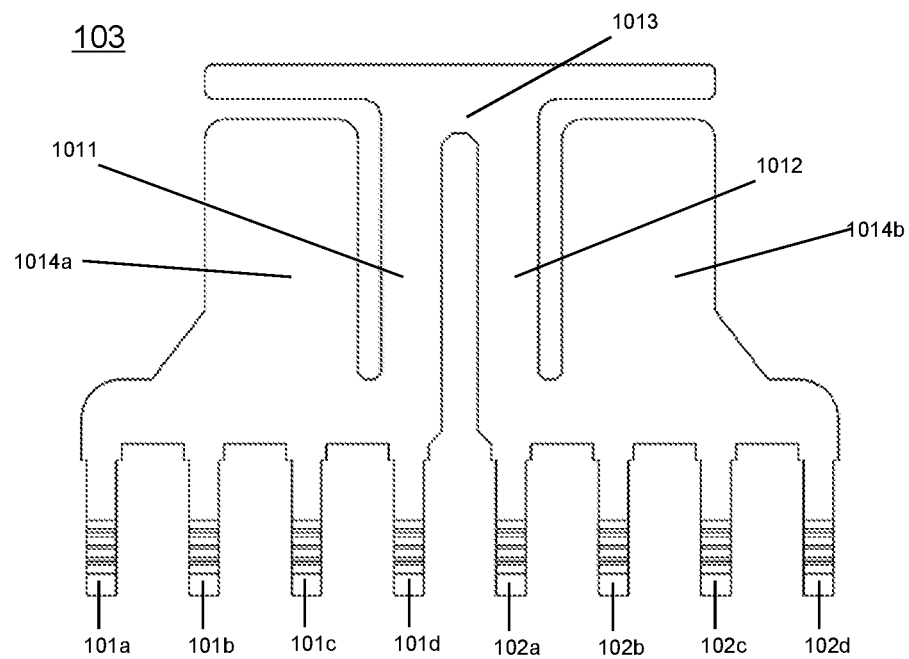
FIG. 3 is a schematic diagram of a conductor of the improved integrated current sensor shown in FIG. 1.

FIG. 3 is a schematic diagram of the conductor 103 in FIG. 1. As shown in FIG. 3, the conductor 103 includes a plurality of current input pins 101a, 101b, 101c and 101d, a plurality of current output pins 102a, 102b, 102c and 102d, a first leg portion 1011 connected to the current input pins, a second leg portion 1012 connected to the current output pins, and a connection portion 1013 connected between the first leg portion 1011 and the second leg portion 1012. Currents on the first leg portion 1011 and the second leg portion 1012 are in opposite directions. The conductor 103 may also be known as a U-shaped conductor because of U-shaped portion thereof. The current input pins are arranged in a spacing manner and of the current output pins arranged in a spacing manner. In one alternative embodiment, the conductor 103 may include only one current input pin, and one current output pin.

As shown in FIGS. 1 and 2, the isolation unit 105 is disposed on an upper side of the conductor 103. The magnetoresistive sensing and signal processing unit is configured on an upper side of the isolation unit 105. In this way, the isolation unit 105 is sandwiched between the magnetoresistive sensing and signal processing unit and the conductor 103, and good electrical isolation between the current side and the signal side can be realized.

The signal pins 104a, 104b, 104c, 104d, 104e, 104f, 104g and 104h are electrically coupled to pads of the magnetoresistive sensing and signal processing unit via wires 109. The package body 111 wraps part of the conductor 103, part of the signal pins, the isolation unit 105 and the magnetoresistive sensing and signal processing unit. The signal pins 104a, 104b, 104c, 104d, 104e, 104f, 104g and 104h are exposed from the package body 111, and the current input pins 101a, 101b, 101c and 101d and the current output pins 102a, 102b, 102c and 102d of the conductor 103 are exposed from the package body 111.

In one embodiment, the magnetoresistive sensing and signal processing unit includes a magnetoresistive sensor 106 and a signal processing unit 107. The magnetoresistive sensor 106 and the signal processing unit 107 are independent from each other and are electrically coupled through wires 108. Pads of the signal processing unit 107 are electrically coupled to the signal pins via wires 109. The magnetoresistive sensor 106 is disposed to be opposite to the first leg portion 1011 and the second leg portion 1012 of the conductor 103 via the isolation unit 105.

As shown in FIGS. 1 and 2, the integrated current sensor 100 further includes: a first magnet 110a configured on an outer side of the first leg portion 1011 and a second magnet 110b configured on an outer side of the second leg portion 1012. The conductor 103 includes a first supporting portion 1014a configured to support the first magnet 110a and a second supporting portion 1014b configured to support the second magnet 110b.

A current flows into the conductor 103 from the current input pins 101, flows through the U-shaped conductor 103, and flows out of the conductor 103 from the current output pins 102. The current flowing through the U-shaped conductor 103 generates a magnetic field in a magnetically sensitive region of the magnetoresistive sensor 106. The magnetoresistive sensor 106 senses the magnetic field to generate a voltage for representing the magnetic field. The signal processing unit 107 processes the voltage and finally output a detection signal though the signal pins 104. Thus, the current is sensed.

Figure 4:
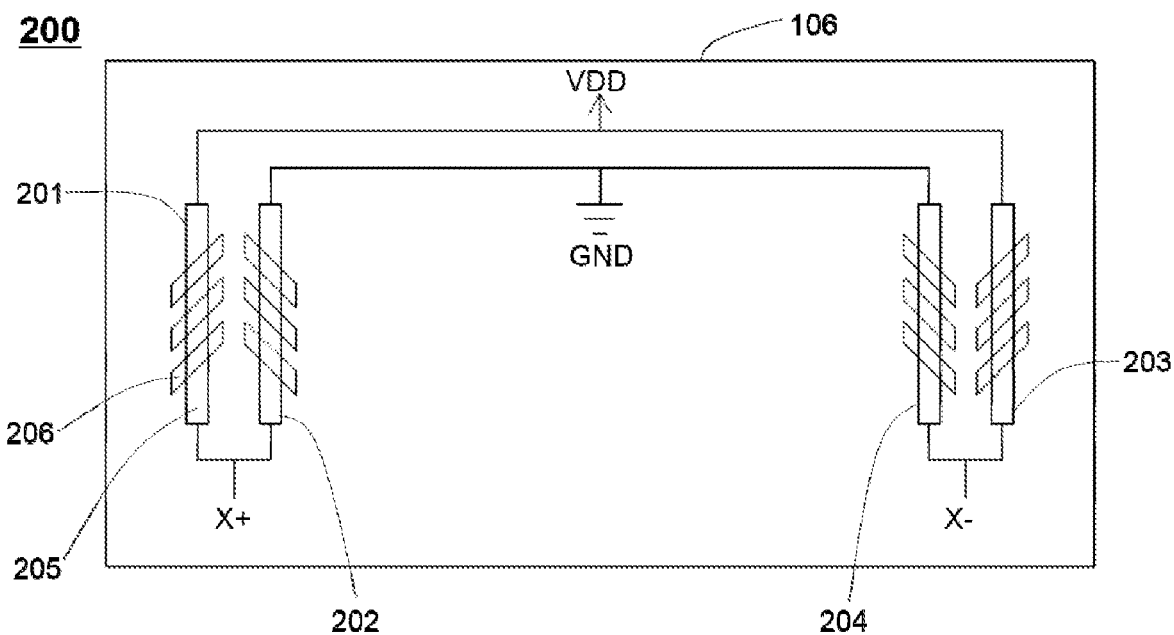
FIG. 4 is a schematic diagram of a magnetoresistive sensor with a Wheatstone bridge circuit of the improved integrated current sensor shown in FIG. 1.

FIG. 4 is a schematic structural diagram of the magnetoresistive sensor with a Wheatstone bridge circuit of the improved integrated current sensor shown in FIG. 1 The magnetoresistive sensor 106 includes a first group of magnetoresistive units and a second group of magnetoresistive units. The first group of magnetoresistive units is disposed to be opposite to the first leg portion 1011 of the conductor 103 via the isolation unit 105. The second group of magnetoresistive units is disposed to be opposite to the second leg portion 1012 of the conductor 103 via the isolation unit 105. The first group of magnetoresistive units and the second group of magnetoresistive units form a Wheatstone bridge circuit. The first group of magnetoresistive units includes a first magnetoresistive unit 201 and a second magnetoresistive unit 202. The second group of magnetoresistive units includes a third magnetoresistive unit 203 and a fourth magnetoresistive unit 204. Each magnetoresistive unit includes a magnetoresistive bar 205 and a plurality of mutually parallel conductive stripes 206 disposed on the magnetoresistive bar 205 and forming a predetermined angle with the magnetoresistive bar. An extending direction of the magnetoresistive bar 205 is parallel to an extending direction of the first leg portion and the second leg portion. For a uniform external magnetic field in any direction, output voltages from output terminals X+, X− of the Wheatstone bridge circuit are zero. The magnetoresistive unit is an anisotropic magnetoresistive based unit AMR, a giant magnetoresistive based unit GMR or a tunneling magnetoresistive based unit TMR.

Figure 5:
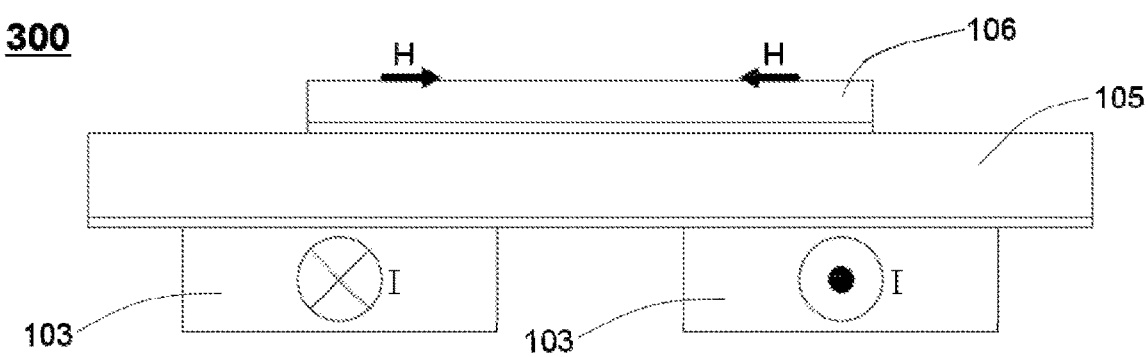
FIG. 5 is a cross-sectional schematic diagram along a section line A-A in FIG. 1, wherein only the magnetoresistive sensor, an isolation unit and the conductor are illustrated.

FIG. 5 is a cross-sectional schematic diagram along a section line A-A in FIG. 1, wherein only the magnetoresistive sensor 106, the isolation unit 105 and the U-shaped conductor 103 below the isolation unit are illustrated. The current I flowing through the U-shaped conductor 103 generates magnetic fields H with equal sizes and opposite directions in left and right magnetically sensitive regions (the first group of magnetoresistive units and the second group of magnetoresistive units) of the magnetoresistive sensor 106, and the Wheatstone bridge circuit generates a voltage output, thereby achieving the objective of sensing the current I.

Figure 6:
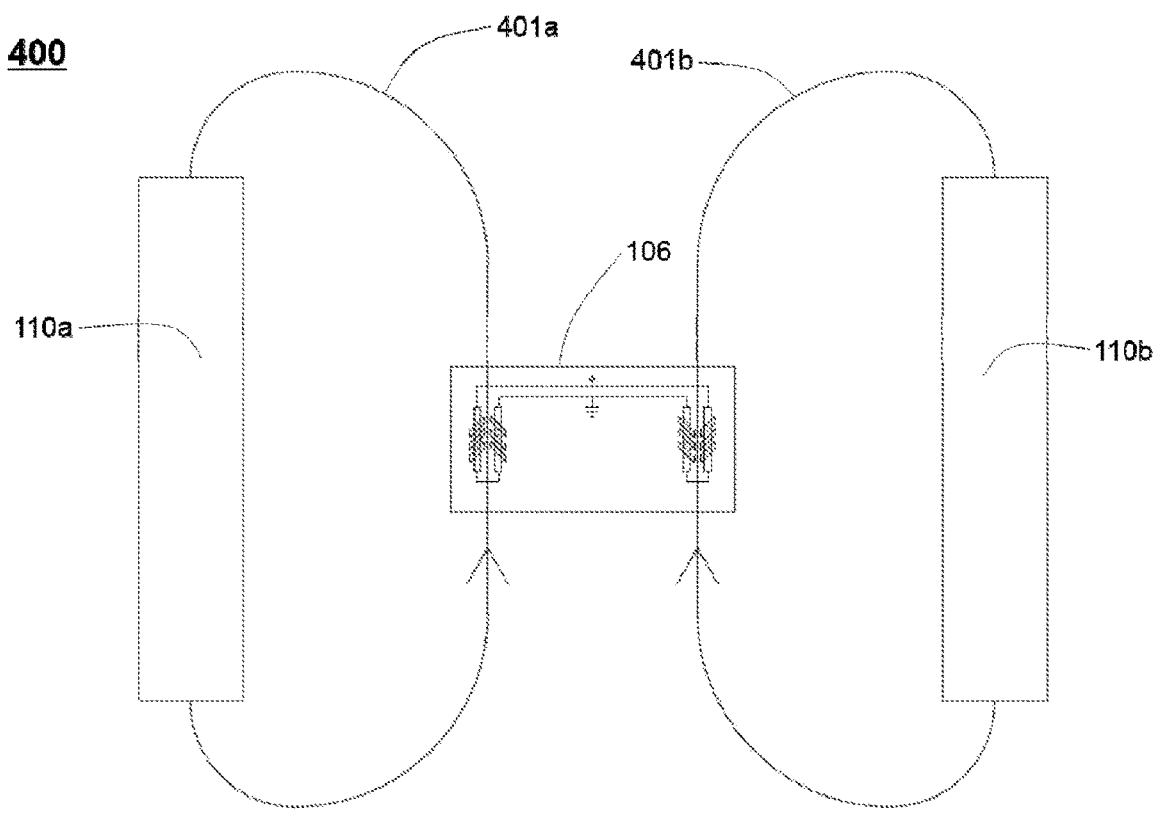
FIG. 6 is a principle diagram showing that two magnets in the present invention initialize magnetic moments of magnetoresistive sensors.

FIG. 6 is a principle diagram showing that the two magnets initialize magnetic moments of the magnetoresistive sensor 106. 401a represents a magnetic induction line distribution of the first magnet 110a. The magnetic field generated by the first magnet 110a in the left magnetically sensitive region (the first group of magnetoresistive units) of the magnetoresistive sensor 106 may initialize the magnetic moments of the magnetoresistive bars of the first group of magnetoresistive units on the left side. 401b represents a magnetic induction line distribution of the second magnet 110b. The magnetic field generated by the second magnet 110b in the right magnetically sensitive region (the second group of magnetoresistive units) of the magnetoresistive sensor 106 may initialize the magnetic moments of the magnetoresistive bars of the second group of magnetoresistive units on the right side. The magnetic moments of the magnetoresistive sensor 106 are initialized by the magnets 110, so that an output signal of the magnetoresistive sensor 106 is accurate. The magnets 110 are preferably sintered samarium cobalt magnets.

Figure 7:
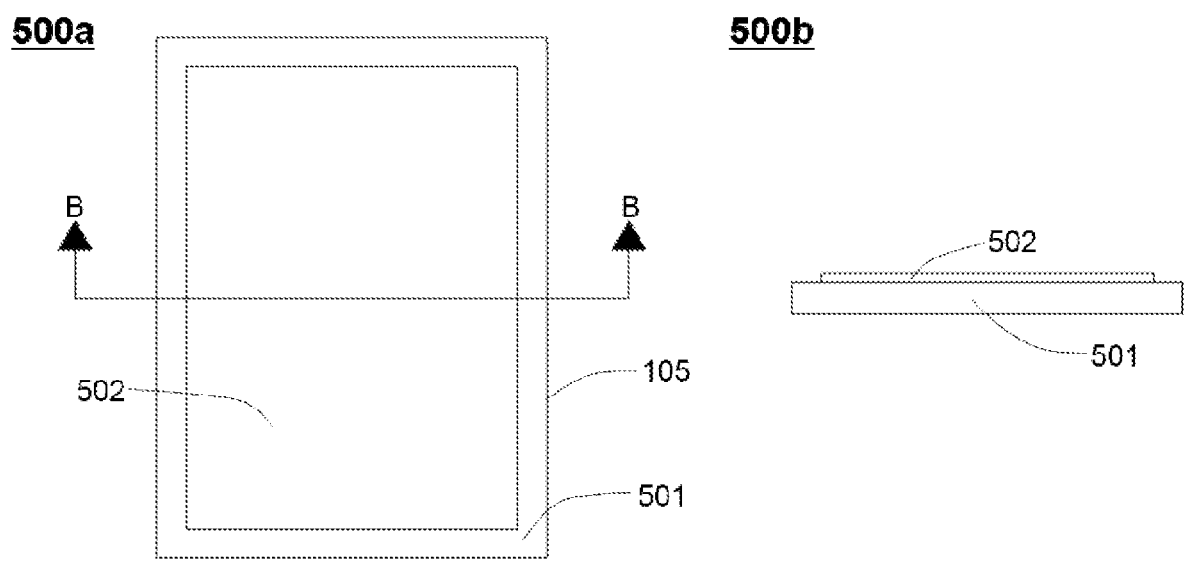
FIG. 7 is a top view of the isolation unit of the improved integrated current sensor shown in FIG. 1 and a sectional view along a section line B-B.

FIG. 7 is a top view 500a of the isolation unit 105 and a sectional view 500b along a section line B-B in the present invention. The isolation unit 105 includes an insulating substrate 501 and a conductive thin film 502 formed on the insulating substrate. The insulating substrate 501 may realize good electrical isolation between the current side and the signal side. The conductive thin film 502 is electrically coupled to one ground pin 104b of the signal pins through a wire 109b. In this way, the influence on the signal pins 104 due to voltage fluctuation at the current side may be eliminated. The insulating substrate 501 is preferably a glass substrate, a magnesium oxide substrate, a ceramic substrate or a silicon nitride substrate. As shown in FIG. 7, an edge of the insulating substrate 501 is spaced from an edge of the conductive thin film 502 at a predetermined distance. In this way, a dielectric distance may be lengthened, and the dielectric strength is enhanced. In another embodiment, the edge of the insulating substrate 501 may also be aligned with the edge of the conductive thin film 502, so as to facilitate manufacturing.

In the present invention, unless otherwise specified, the terms indicating electrical connection, such as "connect", indicate direct or indirect electrical connection.

Obviously, a person skilled in the art may make various changes and variations to the application without departing from the spirit and scope of the application. Thus, if these modifications and variations of this application fall within the scope of the claims and their equivalent technologies, the application is also intended to include these changes and variations.

What is claimed is:

1. An integrated current sensor, comprising:
a conductor comprising at least one current input pin, at least one current output pin, a first leg portion connected to the at least one current input pin, a second leg portion connected to the at least one current output pin, and a connection portion connected between the first leg portion and the second leg portion;
a magnetoresistive sensing and signal processing unit;
an isolation unit configured to be sandwiched between the magnetoresistive sensing and signal processing unit and the conductor;
a plurality of signal pins configured for being coupled to the magnetoresistive sensing and signal processing unit via wires respectively;
a package body configured for wrapping part of the conductor, part of the signal pins, the isolation unit and the magnetoresistive sensing and signal processing unit;
wherein direction of current on the first leg portion is opposite to a direction of current on the second leg portion, and the signal pins, the at least one current input pin and the at least one current output pin are exposed from the package body;
wherein the magnetoresistive sensing and signal processing unit comprises a magnetoresistive sensor and a signal processing unit, and the magnetoresistive sensor comprises a first group of magnetoresistive units and a second group of magnetoresistive units;
wherein the first group of magnetoresistive units are disposed to be opposite to the first leg portion of the conductor via the isolation unit, the second group of magnetoresistive units are disposed be opposite to the second leg portion of the conductor via the isolation unit, and the first group of magnetoresistive units and the second group of magnetoresistive units form a Wheatstone bridge circuit; and
wherein the first group of magnetoresistive units comprise a first magnetoresistive unit and a second magnetoresistive unit, and the second group of magnetoresistive units comprise a third magnetoresistive unit and a fourth magnetoresistive unit.

2. The integrated current sensor according to claim 1, wherein the isolation unit comprises an insulating substrate and a conductive thin film formed on the insulating substrate, and the conductive thin film is electrically coupled to a ground pin of the signal pins through a wire.

3. The integrated current sensor according to claim 2, wherein an edge of the insulating substrate is aligned with an edge of the conductive thin film, or an edge of the insulating substrate is spaced from an edge of the conductive thin film at a predetermined distance; and wherein the insulating substrate is a glass substrate, a magnesium oxide substrate, a ceramic substrate or a silicon nitride substrate.

4. The integrated current sensor according to claim 1, wherein the magnetoresistive sensing and signal processing unit comprises a magnetoresistive sensor and a signal processing unit, the magnetoresistive sensor and the signal processing unit are independent from each other and are electrically coupled to each other through wires, the signal processing unit is electrically coupled to the signal pins via wires, and the magnetoresistive sensor is disposed to be opposite to the first leg portion and the second leg portion of the conductor via the isolation unit.

5. The integrated current sensor according to claim 1, wherein each magnetoresistive unit comprises a magnetoresistive bar and a plurality of parallel conductive stripes disposed on the magnetoresistive bar and forming a predetermined angle with the magnetoresistive bar; an extending direction of the magnetoresistive bar is parallel to an extending direction of the first leg portion and the second leg portion; and the magnetoresistive unit is an anisotropic magnetoresistive based unit, a giant magnetoresistive based unit or a tunneling magnetoresistive based unit.

6. The integrated current sensor according to claim 1, further comprising:
a first magnet disposed on an outer side of the first leg portion and configured to initialize magnetic moments of the first group of magnetoresistive units; and
a second magnet disposed on an outer side of the second leg portion and configured to initialize magnetic moments of the second group of magnetoresistive units,
wherein the first magnet and the second magnet are both wrapped in the package body.

7. The integrated current sensor according to claim 6, wherein the conductor comprises a first supporting portion configured to support the first magnet and a second supporting portion configured to support the second magnet.

8. The integrated current sensor according to claim 6, wherein the magnets are sintered samarium cobalt magnets.

9. The integrated current sensor according to claim 1, wherein the conductor is a U-shaped conductor, the at least one current input pin is a plurality of current input pins arranged in a spacing manner, and at least one current output pin a plurality of current output pins arranged in a spacing manner.

* * * * *